United States Patent [19]

Neely

[11] Patent Number: 4,745,308
[45] Date of Patent: May 17, 1988

[54] NON-INVERTING THREE STATE TTL LOGIC WITH IMPROVED SWITCHING FROM A HIGH IMPEDANCE STATE TO AN ACTIVE HIGH STATE

[75] Inventor: Eric D. Neely, Phoenix, Ariz.

[73] Assignee: Motorola, Inc., Schaumburg, Ill.

[21] Appl. No.: 467,681

[22] Filed: Feb. 18, 1983

[51] Int. Cl.[4] .............. H03K 19/003; H03K 19/084; H03K 19/088; H03K 17/16

[52] U.S. Cl. .................... 307/473; 307/456; 307/458; 307/443

[58] Field of Search ............. 307/443, 456, 457, 458, 307/473, 254, 255, 270, 513

[56] References Cited

U.S. PATENT DOCUMENTS

| | | | |
|---|---|---|---|
| 3,792,292 | 2/1974 | Priel | 307/473 |
| 3,980,898 | 9/1976 | Priel | 307/473 |
| 4,174,541 | 11/1979 | Schmitz | 307/458 X |
| 4,339,676 | 7/1982 | Ramsey | 307/458 X |
| 4,424,455 | 1/1984 | Neely | 307/458 X |
| 4,467,223 | 8/1984 | Neely | 307/456 X |

FOREIGN PATENT DOCUMENTS 31228  3/1981  Japan ...................... 307/473

Primary Examiner—Stanley D. Miller
Assistant Examiner—David R. Bertelson
Attorney, Agent, or Firm—William E. Koch

[57] ABSTRACT

A three state gate having an output capable of assuming an active high, an active low, or a high impedance state is disclosed that eliminates a glitch in the output during the transition from the high impedance state to an active high. An output means includes a first transistor for supplying current to the output and a second transistor for draining current from the output. A phase splitting means determines the conductivity of the first and second transistors. A logic means is responsive to both an input signal and an output enable signal and is coupled to the phase splitting means. The logic means includes a level setting means that insures that the second transistor is not conductive during the transition of the output from the active high to the high impedance state.

6 Claims, 2 Drawing Sheets

- *PRIOR ART* -

NON-INVERTING THREE STATE TTL LOGIC WITH IMPROVED SWITCHING FROM A HIGH IMPEDANCE STATE TO AN ACTIVE HIGH STATE

BACKGROUND OF THE INVENTION

1. Field of the Invention

This invention relates, in general, to three state gates and more particularly to a non-inverting, glitchless three state gate that does not supply current to an input bus.

2. Background Art

Three state gates have an output which is capable of assuming an active high, an active low, or a high impedance state. Previously known non-inverting, three state gates typically comprise a push-pull output driver stage, a phase splitting stage, and an input stage as illustrated in FIG. 1 which will be discussed in detail hereinafter in the Detailed Description of the Invention. The push-pull output driver stage comprises a dual transistor arrangement wherein an upper transistor is coupled between a DC voltage supply and an output load and a lower transistor is coupled between the output load and ground. In operation a high output voltage is realized at the output terminal by turning on the upper transistor and turning off the lower transistor; a low output voltage is realized by turning off the upper transistor and turning on the lower transistor; and a high impedance is achieved by turning off both transistors.

The phase splitting stage comprises a transistor coupled between the bases of the two transistors of the output stage that would selectively turn on one of the two output stage transistors. The input stage comprises a PNP transistor having a base connected to an input terminal. A first NPN transistor has its base connected to the emitter of the PNP transistor. A second NPN transistor has a base connected to the emitter of the first NPN transistor. The bases of the first NPN transistor, the second NPN transistor, the phase splitting transistor, and the output stage upper transistor are each coupled to an output enable terminal by a diode. A low output enable signal directs current away from the transistor bases through these diodes, thus turning off both of the upper and lower transistors of the output stage, giving a high impedance at the output terminal. A high signal on the output enable terminal reverse biases the diodes, effectively removing their paths from the circuit.

However, when switching from the high impedance state to an active high, this previously known arrangement would have a glitch in the output, wherein the output would tend to go to an active low from the high impedance state prior to going to the active high. This glitch could be avoided by removing the diode coupled between the base of the first NPN transistor (the emitter of the PNP transistor) and the output enable terminal. However, by removing this diode, problems are created in a bus oriented system. Current would then flow to the input bus from the PNP transistor.

Thus, a need exists for an improved non-inverting three state gate having a smooth, glitchless transition from a high impedance state to an active high while preventing current from flowing to the input terminal.

SUMMARY OF THE INVENTION

Accordingly, it is an object of the present invention to provide an improved non-inverting three state gate. Another object of the present invention is to provide a glitchless, non-inverting three state gate that does not supply current to the input terminal.

In carrying out the above and other objects of the invention in one form, there is provided an improved three state gate capable of assuming a first state, a second state, or a high impedance state at an output. The gate is adapted to receive first and second input signals which are each capable of assuming first or second voltage levels. An output means includes a first output transistor for supplying current to the output load when the first input signal has assumed the first voltage level and the second input signal has assumed the first voltage level, and a second output transistor for sinking current from the output load when the first input signal has assumed the second voltage level and the second input signal has assumed the first voltage level. The first output transistor will not supply current to the output load and the second output transistor will not sink current from the output load when the second input signal assumes the second voltage level. A logic means is coupled to the output means and is responsive to the first and second input signals. A level setting means is coupled to the logic means for substantially preventing glitches in the output when the first input signal has assumed the first voltage level and when the second input signal assumes the first voltage level.

The above and other objects, features, and advantages of the present invention will be better understood from the following detailed description taken in conjunction with the accompanying drawings.

DETAILED DESCRIPTION OF THE INVENTION

Figure 1:
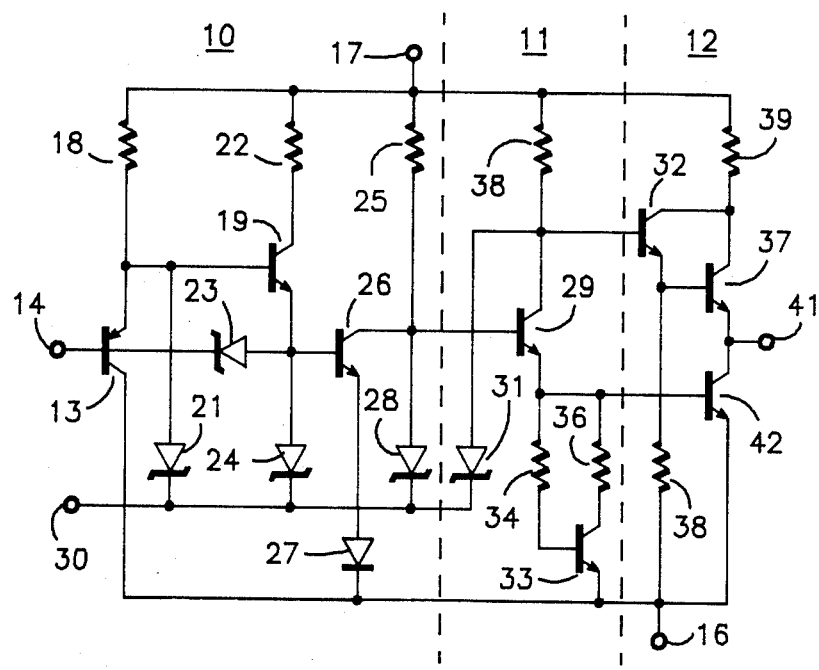
FIG. 1 illustrates in schematic form a prior art three state gate.

FIG. 1 shows a prior art circuit illustrative of the problem of eliminating the glitch occuring during the high impedance state to digital high state transition while preventing current from flowing to the input terminal. The prior art circuit includes an input stage 10, a phase splitting stage 11, and a push-pull output driver stage 12.

The input stage 10 comprises PNP transistor 13 having a base connected to input terminal 14 and is responsive to an input signal which may assume a first or second voltage level. Transistor 13 has its collector connected to supply voltage terminal 16 and an emitter coupled to supply voltage terminal 17 by resistor 18. The emitter of transistor 13 is further connected to the base of NPN transistor 19 and to the anode of Schottky diode 21. Transistor 19 has its collector coupled to supply voltage terminal 17 by resistor 22 and its emitter connected to the anodes of Schottky diodes 23, 24 and the base of NPN transistor 26. Transistors 13, 19 and diode 23 translate the voltage level of the input signal at input terminal 14 to the base of transistor 26 while providing isolation from input terminal 14. Diode 27 has its anode connected to the emitter of transistor 26 and its cathode connected to supply voltage terminal 16. The collector of transistor 26 is connected to the anode of diode 28 and the base of phase splitting NPN transistor 29 and is coupled to supply voltage terminal 17 by resistor 25.

The collector of transistor 29 is connected to the anode of Schottky diode 31, the base of NPN transistor 32, and is coupled to supply voltage terminal 17 by resistor 38. The cathodes of Schottky diodes 21, 24, 28, 31 are connected to output enable terminal 30 for sinking current from the bases of transistors 19, 26, 29, 32, respectively, when the output enable signal has a low voltage level. The emitter of transistor 29 is coupled to the base and emitter of NPN transistor 33 by resistor 34 and resistor 36, respectively. The emitter of transistor 33 is connected to supply voltage terminal 16. Transistor 33 and resistors 34, 36 provide an active pull down for the base of transistor 42. The emitter of transistor 32 is connected to the base of NPN transistor 37 and is coupled to supply voltage terminal 16 by resistor 38. Supply voltage terminal 17 is coupled to the collectors of transistors 32, 37 by resistor 39. Output terminal 41 is connected to the emitter of transistor 37 for supplying current thereto and the collector of transistor 42 for sinking current therefrom. The emitter of transistor 42 is connected to supply voltage terminal 16.

A low voltage level applied to output enable terminal 30 will divert current through diodes 21, 24, 28, 31 from the bases of transistors 19, 26, 29, 32, respectively, insuring their nonconductivity. Since transistors 29, 32 are off, the bases of transistors 37, 42 will not receive any current. With both of transistors 37, 42 off, output terminal 41 will reflect a high impedance. However, when a high voltage level is applied to output enable terminal 30, diodes 21, 24, 28, 31 are reverse biased, effectively taking their paths out of the circuit. A high voltage level on input terminal 14 will turn off transistor 13, thereby translating a high signal to the bases of transistors 19, 26. With transistor 26 on, the base of transistor 29 goes low, turning off transistor 29 and translating a high signal to the basis of transistors 32, 37 and translating a low voltage level to the base of transistor 42. With transistor 37 on and transistor 42 off, output terminal 41 reflects an active high state.

A low voltage level on input terminal 14 will turn on transistor 13, thereby translating a low to the bases of transistors 19, 26. With transistor 26 off, the base of transistor 29 goes high, turning on transistor 29 and translating a low voltage level to the bases of transistors 32, 37 and translating a high voltage level to the base of transistor 42. With transistor 37 off and transistor 42 on, output terminal 41 reflects an active low state.

Figure 2:
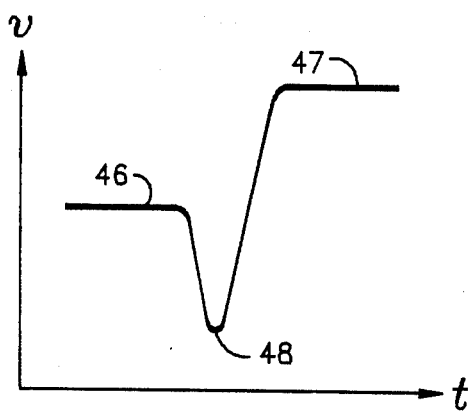
FIG. 2 illustrates a wave-form of the output of the prior art circuit of FIG. 1 when the output is switched from the high impedance state to an active high state.

FIG. 2 illustrates the voltage characteristics of the output signal at output terminal 41 as the state of the circuit switches from a high impedance to an active high. The high impedance state is represented by waveform portion 46 and the active high is represented by waveform portion 47. A glitch 48 occurs as the output signal switches from the high impedance state 46 to the active high state 47. This glitch 48 is caused by the inherent characteristics of the circuit of FIG. 1. When a low voltage level is applied to output enable terminal 30, the bases of transistors 29, 32 are both pulled low, turning off transistors 29, 32, 37, 42. When input terminal 14 is receiving a high voltage level and output enable terminal 30 receives a high voltage level, transistor 29 will initially turn on since the drop across transistors 29, 42 and diode 28 is only about one and a half volts. As output enable terminal 30 approaches a high voltage level, transistors 19, 26 will turn on since the voltage drop across transistors 19, 26 and diode 27 is about 2.25 volts. Transistor 29 would then turn off since its base current is diverted through the collector of transistor 26.

Figure 3:
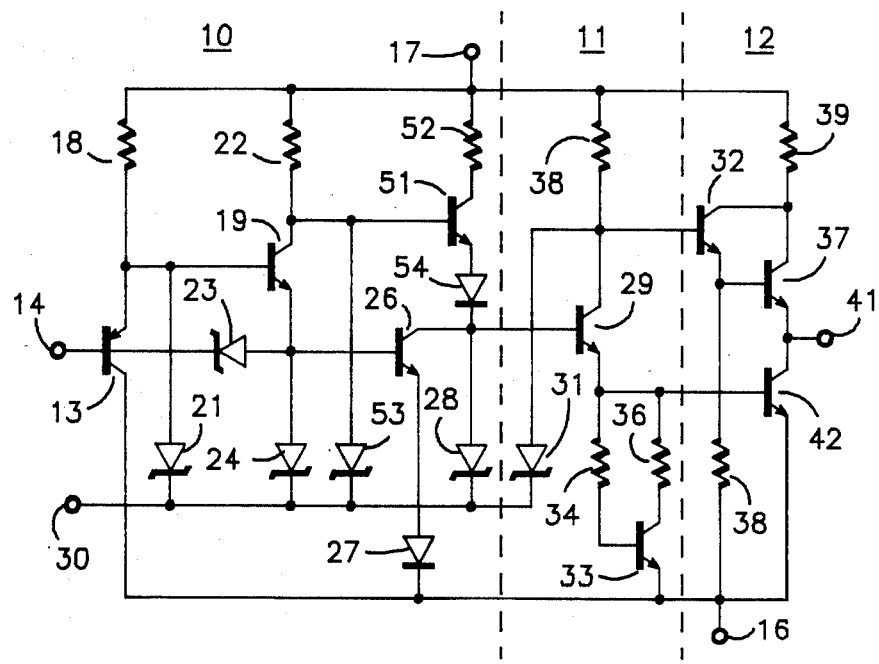
FIG. 3 illustrates in schematic form the preferred embodiment of the present invention.

Referring now to FIG. 3, there is shown a circuit illustrating a preferred embodiment of the present invention. The circuit of FIG. 3 is similar to the prior art circuit of FIG. 1, having similar devices identified with identical numbers for ease of description. The circuit of FIG. 3 includes four additional devices including NPN transistor 51, resistor 52, and diodes 53, 54. Transistor 51 has its base connected to the collector of transistor 19 and to the anode of diode 53. The cathode of diode 53 is connected to output enable terminal 30. Transistor 51 has its collector coupled to supply voltage terminal 17 by resistor 52 and its emitter connected to the anode of diode 54. The cathode of diode 54 is connected to the base of transistor 29 and the collector of transistor 26. In another embodiment, not shown, a diode can be substituted for transistor 51 wherein its cathode would be connected to the anode of diode 54 and its anode would be connected to the anode of diode 53 and coupled to supply voltage terminal 17 by resistor 52.

When the voltage level of the output enable signal is high, thereby reverse biasing diodes 21, 24, 28, 31, 53 and the voltage level of the input signal at terminal 14 is low, transistor 13 is turned on, causing the base of transistor 19 to go low. Since transistor 19 is off, the collector of transistor 19 goes high and transistor 51 is turned on, thereby supplying current to the base of transistor 29. With transistor 29 on, current is supplied to the base of transistor 42 causing output terminal 41 to reflect an active low state.

When the voltage level of the input signal at the base of transistor 13 is high, current is supplied to the base of transistor 19 and therefore to the base of transistor 26. A low is translated to the base of transistor 51 rendering it nonconductive. Since transistor 26 is conductive, no current is available for the base of transistor 29, thereby resulting in transistors 32, 37 being conductive and a high output at output terminal 41.

Diodes 21, 23, 24, 28, 31, 53 are Schottky diodes while diodes 27, 54 are PN junction diodes. The type of diode was selected for the purpose of adjusting the threshold of the current path therefor. It is understood that Schottky diodes and PN junction diodes may be interchanged as long as the threshold relationship of the two current paths discussed below are maintained. The current path including transistor 51, diode 54, transistor 29, and transistor 42 must have a larger threshold than the current path including transistor 19, transistor 26, and diode 27. As the voltage level of the output enable signal initially begins to go high, this threshold differential insures that transistors 19, 26 turn on before transistor 29, with transistor 26 sinking current from the base of transistor 29 thereby maintaining transistor 29 nonconductive. Furthermore, additional diodes may be added in series with diode 54 to adjust the threshold of the current path.

By now it should be appreciated that there has been provided a gitchless, non-inverting three state gate that does not supply current to an input bus.

I claim:

1. A non-inverting three state gate having at least one input terminal, an output terminal, a first voltage terminal, a second voltage terminal, an input stage coupled between said first and second voltage terminals and to said at least one input terminals, a phase splitting stage coupled between said first and second voltage terminals, and an output stage coupled between said first and second voltage terminals and to said phase splitting stage, said output stage providing a first state output, a second state output, or a high impedance state output at said output terminal, said input stage having biasing means coupled to said phase splitting stage to inhibit said output stage from momentarily providing said second state output when said output stage is switching from said high impedance state output to said first state output.

2. An improved non-inverting three state gate having an output signal capable of assuming a first state, a second state, and a high impedance state at an output terminal, said gate coupled to receive a first input signal at a first input terminal and a second input signal at a second input terminal, both of said first and second input signals capable of assuming first or second voltage levels, including a first voltage terminal, a second voltage terminal, an output means having a first output transistor coupled between said first voltage terminal and said output terminal for supplying current to said output terminal when said first input signal has assumed said first voltage level and said second input signal has assumed said first voltage level, and a second output transistor coupled between said output terminal and said second voltage terminal for sinking current from said output terminal when said first input signal has assumed said second voltage level and said second input signal has assumed said first voltage level, said first output transistor not supplying current to said output terminal and said second output transistor not sinking current from said output terminal when said second input signal assumes said second voltage level, phase splitting means coupled to said output means for controlling said first and second output transistors including a phase splitting transistor having a collector coupled to both a base of said first output transistor and said first voltage terminal and, an emitter coupled to both a base of said second output transistor and said second voltage terminal, an input means including a PNP transistor having a base coupled to said first input terminal, an emitter coupled to said first voltage terminal and a collector coupled to said second voltage terminal, a first NPN transistor having a base coupled to an emitter of said PNP transistor, a collector coupled to said first voltage terminal, a second NPN transistor having a base coupled to the emitter of said first NPN transistor and a collector coupled to the base of said phase splitting transistor, a first diode coupled between the emitter of said second NPN transistor and said second voltage terminal, the improvement comprising:
 a third NPN transistor having a base coupled to a collector of said first NPN transistor and a collector coupled to said first voltage terminal;
 a second diode having a cathode coupled to said second input terminal and an anode coupled to the base of said third NPN transistor; and
 a third diode having a cathode coupled to the base of said phase splitting transistor and an anode coupled to the emitter of said third NPN transistor.

3. A non-inverting three state gate capable of assuming a first state, a second state, or a high impedance state as an output signal at an output terminal, said gate coupled to receive a first input signal at a first input terminal and a second input signal at a second input terminal, both of said first and second input signals capable of assuming first or second voltage levels, comprising:
 output means coupled between said first and second voltage terminals, said output means including a first output transistor for supplying current to said output when said first input signal has assumed said first voltage level and said second input signal has assumed said first voltage level, and a second output transistor for sinking current from said ouput when said first input signal has assumed said second voltage level and said second input signal has assumed said first voltage level, said first output transistor not supplying current to said output and said second output transistor not sinking current from said output when said second input signal assumes said second voltage level;
 phase splitting means coupled between said first and second voltage terminals and coupled to said output means for controlling said first and second output transistors; and
 level setting means coupled between said first and second voltage terminals and coupled to said phase splitting means and responsive to said first and second input signals for substantially preventing glitches in said output when said first input signal has assumed said first voltage level and when said second input signal assumes said first voltage level.

4. The circuit according to claim 3 wherein said level setting means comprises:
 at least one first semiconductor device coupled between said first voltage terminal and said phase splitting means comprising a first current path having a first threshold, for controlling said phase splitting means; and
 at least one second semiconductor device coupled between said first and second voltage terminals and coupled to said phase splitting means comprising a second current path having a second threshold, said second threshold being less in value than said first threshold, said at least one second semiconductor device disabling said second current path when said first input signal assumes said first level.

5. The circuit according to claim 3 wherein said phase splitting means comprises a phase splitting transistor having a collector coupled to both said first voltage terminal and said first output transistor, an emitter coupled to both said second voltage terminal and said second output transistor, and a base coupled to said level setting means.

6. The circuit according to claim 5 wherein said level setting means comprises:
 a PNP transistor having a base coupled to said first input terminal, an emitter coupled to said first voltage terminal, and a collector coupled to said second voltage terminal;
 a first NPN transistor having a base coupled to the emitter of said PNP transistor and a collector coupled to said first voltage terminal;
 a second NPN transistor having a base coupled to the emitter of said first NPN transistor, a collector coupled to the base of said phase splitting transistor;
 a third NPN transistor having a base coupled to the collector of said first NPN transistor and a collector coupled to said first voltage terminal;
 a first diode having a cathode coupled to the base of said PNP transistor and an anode coupled to the base of said second NPN transistor;

a second diode having a cathode coupled to the base of said phase splitter transistor and an anode coupled to the emitter of said third NPN transistor;

a third diode having a cathode coupled to said second input terminal and an anode coupled to the base of said first NPN transistor;

a fourth diode having a cathode coupled to said second input terminal and an anode coupled to the base of said second NPN transistor;

a fifth diode having a cathode coupled to said second input terminal and an anode coupled to the base of said third NPN transistor;

a sixth diode having a cathode coupled to said second input terminal and an anode coupled to the base of said phase splitting transistor;

a seventh diode having a cathode coupled to said second input terminal and an anode coupled to the collector of said phase splitting transistor; and an eighth diode having a cathode coupled to said second voltage terminal and an anode coupled to the emitter of said second NPN transistor, wherein the threshold of a current path comprising said third NPN transistor, said second diode, said phase splitting transistor, and said second output transistor is larger than the threshold of a current path comprising said first NPN transistor, said second NPN transistor, and said eighth diode.

* * * * *